(12) United States Patent
Shin et al.

(10) Patent No.: US 7,986,552 B2
(45) Date of Patent: Jul. 26, 2011

(54) NONVOLATILE MEMORY DEVICE AND METHOD OF OPERATION TO PROGRAM/READ DATA BY ENCODING/DECODING USING ACTUAL DATA AND RANDOM DATA FOR PROGRAM/READ OPERATION

(75) Inventors: Tao Ho Shin, Gyeonggi-do (KR); Joong Seob Yang, Gyeonggi-do (KR); Jun Seop Chung, Gyeonggi-do (KR); You Sung Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 193 days.

(21) Appl. No.: 12/400,847

(22) Filed: Mar. 10, 2009

(65) Prior Publication Data

US 2009/0225597 A1 Sep. 10, 2009

(30) Foreign Application Priority Data

Mar. 10, 2008 (KR) ........................ 10-2008-0021942
Feb. 10, 2009 (KR) ........................ 10-2009-0010586

(51) Int. Cl.
*G11C 16/04* (2006.01)

(52) U.S. Cl. .......... 365/185.02; 365/189.15; 365/189.16

(58) Field of Classification Search ............. 365/185.02, 365/189.011, 189.15, 189.16
See application file for complete search history.

(56) References Cited

U.S. PATENT DOCUMENTS

| 6,279,133 | B1* | 8/2001 | Vafai et al. ........................ 714/763 |
| 6,549,446 | B2* | 4/2003 | Morley et al. ........................ 365/97 |
| 7,038,946 | B2 | 5/2006 | Hosono et al. |
| 7,126,850 | B2* | 10/2006 | Tatsukawa et al. ...... 365/185.03 |
| 7,774,615 | B2* | 8/2010 | Bardouillet et al. .......... 713/187 |
| 7,796,429 | B2* | 9/2010 | Kanno et al. ............. 365/185.03 |
| 7,826,277 | B2* | 11/2010 | Shin et al. ................ 365/189.05 |

OTHER PUBLICATIONS

Notice of Allowance issued from Korean Intellectual Property Office on Feb. 7, 2011.

* cited by examiner

*Primary Examiner* — VanThu Nguyen
(74) *Attorney, Agent, or Firm* — IP & T Group LLP

(57) ABSTRACT

A nonvolatile memory device includes a data conversion unit including an encoder and a decoder. The encoder sets data for each of word lines and creates second data to be programmed into a plurality of memory cells by performing a logical operation on the set data and first data input for programming. The decoder creates the first data by performing a logical operation on the second data that is read from the memory cells and the set data.

16 Claims, 8 Drawing Sheets

NONVOLATILE MEMORY DEVICE AND METHOD OF OPERATION TO PROGRAM/READ DATA BY ENCODING/DECODING USING ACTUAL DATA AND RANDOM DATA FOR PROGRAM/READ OPERATION

CROSS-REFERENCES TO RELATED APPLICATIONS

The present application claims priority to Korean patent application number 2008-0021942, filed on Mar. 10, 2008 and Korean patent application number 2009-0010586, filed on Feb. 10, 2009, which are incorporated by reference in its entirety.

BACKGROUND

One or more embodiments relate to a nonvolatile memory device and, more particularly, to a nonvolatile memory device and a method of operating the same and a control device for controlling the same, which is configured to program data, decoded using actual data and random data, when a program or read operation is performed.

Flash memory, that is, nonvolatile memory is chiefly divided into NAND flash memory and NOR flash memory. NOR flash memory has an excellent random access time characteristic because it has a structure in which memory cells are independently connected to respective bit lines and respective word lines. NAND flash memory is excellent in terms of the integration level because it has a structure in which memory cells are connected in series, requiring only one contact per cell string. Accordingly, the NAND structure is for the most part used in highly-integrated flash memory.

Recently, in order to further increase the integration of flash memory, active research has been done on a multi-bit cell which is capable of storing plural data in one memory cell. This type of a memory cell is generally called a Multi-Level Cell (MLC). A memory cell capable of storing a single bit is called a Single Level Cell (SLC).

The MLC has cell voltage levels in order to store plural bits of data, as described above. Using the cell voltage levels, different data is stored depending on respective cell voltages.

FIG. 1 is a diagram showing the construction of the memory cell array of a nonvolatile memory device formed by conventional methods.

Referring to FIG. 1, the memory cell array 110, including memory cells of the nonvolatile memory device, includes cell strings. Furthermore, each of the cell strings is connected to a bit line BL.

Each of the cell strings has a construction in which memory cells C are connected in series between a Drain Select Transistor (DST) and a Source Select Transistor (SST).

The gates of the memory cells are connected to respective word lines WL, which are configured to intersect the bit lines BL. The memory cell array 110 of FIG. 1 includes first to $32^{th}$ word lines WL<0> to WL<31>.

Assuming that a word line selected for program (indicated by "sel") is the $30^{th}$ word line WL<29>, the remaining word lines are unselected word lines (indicated by "unsel").

A page buffer 120 is connected to each pair of the bit lines. In the case where the $30^{th}$ word line WL<29> of the memory cell array 110 is programmed, a program voltage is applied to the $30^{th}$ word line WL<29> and a pass voltage is applied to the remaining word lines.

Here, if the memory cells C are MLCs, each of the memory cells stores plural bits. Thus, threshold voltages for distinguishing between different stored bits during a read operation may be changed depending on whether or not the cells of a string neighboring the memory cells have been programmed (Back Pattern Dependency (hereinafter referred to as 'BPD')).

In order to reduce this BPD, a method of performing an actual program operation from the first word line WL<0> to the $32^{th}$ word line WL<31> in sequence is used.

FIG. 2 illustrates the distributions of threshold voltages of memory cells resulting from BPD.

Referring to FIG. 2, the distributions of threshold voltages of memory cells may be widened because the memory cells are over programmed (OP) or under programmed (UP) due to the influence of surrounding programmed memory cells. If the distributions of threshold voltages distinguishing different bits are widened, a problem arises because, when the threshold voltages have plural distribution states as in a MLC, a margin between the threshold voltages is narrowed.

If, in order to reduce the problem of BPD, a pass voltage applied to an unselected word line to which programmed memory cells are connected is excessively raised, a disturbance phenomenon, where unwanted memory cells are programmed, may occur.

SUMMARY OF THE INVENTION

One or more embodiments are directed towards a nonvolatile memory device and a method of operating the same and a control device for controlling the same, which is capable of randomizing data to be programmed in memory cells and storing the data.

One or more embodiments are directed to a nonvolatile memory device including a data conversion unit. The data conversion unit includes an encoder configured to set data for each of a plurality of word lines and to create a second data to be programmed into a plurality of memory cells by performing a logical operation on the set data and first data input for programming, and a decoder configured to create the first data by performing a logical operation on the second data that is read from the memory cells, and the set data.

The set data is randomly set to a logical '1' or logical '0' for each of the word lines.

One or more embodiments are directed to a nonvolatile memory device including a memory cell array in which memory cells are connected by word lines and bit lines, a page buffer unit comprising page buffer circuits each configured to program data into the memory cells or read data stored in the memory cells, a data conversion unit configured to encode input data for programming into program data by using set data or read stored data and decode the read data into a data state of original input data corresponding to the read data, a Y decoder configured to connect the data conversion unit and the page buffer unit in response to input address information, and a control unit configured to control the data conversion unit so that the data conversion unit selects set data for encoding or decoding according to the address information.

One or more embodiments are directed to a nonvolatile memory device including a memory cell array in which a plurality of memory cells are connected by word lines and bit lines, a page buffer unit comprising page buffer circuits each configured to program data into a memory cell of the memory cells or read data stored in the memory cells, and a Y decoder configured to encode input data for programming, into program data using set data or read stored data, decode the read data into a data state of original input data corresponding to the read data, and output the decoded data.

One or more embodiments are directed to a nonvolatile memory device, including a memory cell array in which memory cells are connected by word lines and bit lines, a page buffer unit, comprising page buffer circuits each configured to program data into a memory cell of the memory cells or read data stored in the memory cell, a Y decoder configured to provide a data I/O path of the page buffer unit in response to input address information, and a data I/O unit connected to the Y decoder and configured to encode input data for programming into program data by using set data or read stored data, decode the read data into a data state of original input data corresponding to the read data, and output the decoded data.

One or more embodiments are directed to a method of operating a nonvolatile memory device, including randomly generating a first logic level data or a second logic level data and storing the first logic level data or the second logic level data as set data of each of a plurality of word lines, creating a second data by performing a logic operation on first data that is input for programming and the set data for a word line selected for the programming, and programming the second data into memory cells of the selected word line.

One or more embodiments are directed to a nonvolatile memory device, including a random data generator configured to generate a random data according to an input address, and a data conversion unit. The data conversion unit includes an encoder configured to create second data to be programmed into memory cells by performing a logic operation on the random data that is generated by the random data generator and first data input for programming, and a decoder configured to create the first data by performing a logical operation on the second data that is read from the memory cell and the random data.

One or more embodiments are directed to a control device for controlling a nonvolatile memory device, including a random data generator configured to generate a random data according to an input address input from a host, and a data conversion unit. The data conversion unit includes an encoder configured to create a second data by performing a logic operation on the random data that is generated by the random data generator, and a first data input from the host and to input the second data to the nonvolatile memory device, and a decoder configured to create the first data by performing a logic operation on the second data that is read from the nonvolatile memory device and the random data and to transmit the first data to the host.

One or more embodiments are directed to a method of operating a nonvolatile memory device, including randomly generating a first logic level data or a second logic level data and storing the first logic level data or the second logic level data as set data of each of a plurality of word lines, creating a second data by performing a logic operation on first data that is input for programming, and the set data for a word line selected for the programming and programming the second data; and reading the second data according to a read command, creating a first data by performing a logic operation on the second data and the set data, and outputting the first data.

One or more embodiments are directed to a method of operating a nonvolatile memory device, including creating a random data using a program or read command and using an input address, when the program command is input, creating second data by performing a logic operation on first data that is input for programming, and the random data and programming the second data into memory cells corresponding to the input address, and when the read command is input, reading the second data stored in the memory cells corresponding to the input address, creating the first data by performing a logic operation on the second data and the random data, and outputting the created first data.

DESCRIPTION OF SPECIFIC EMBODIMENT

Figure 1:
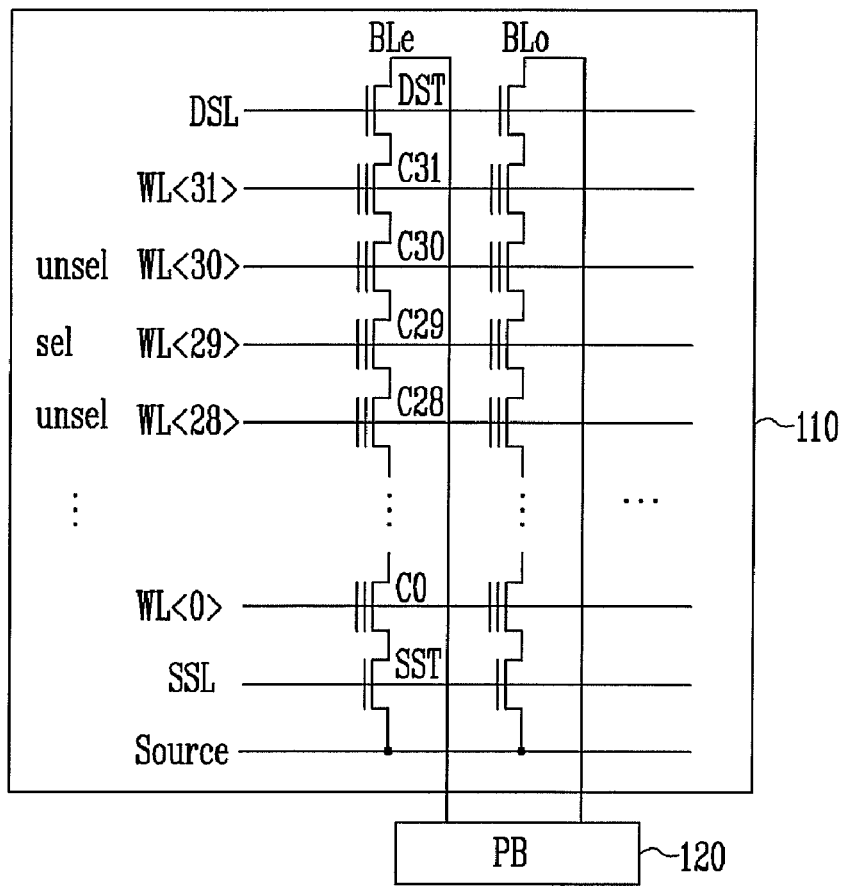
FIG. 1 is a diagram showing the construction of the memory cell array of a nonvolatile memory device formed by conventional methods.
Figure 2:
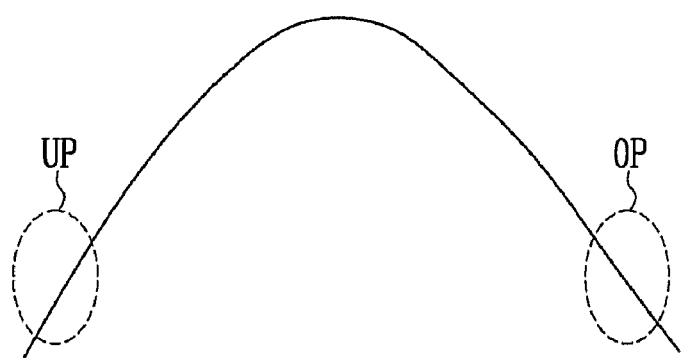
FIG. 2 illustrates the distributions of threshold voltages of memory cells resulting from BPD.

Hereinafter, the present disclosure will be described in detail in connection with one or more embodiments with reference to the accompanying drawings. The figures are provided to allow those having ordinary skill in the art to understand the scope of one or more embodiments of the disclosure. To clarify multiple layers and regions, the thickness of the layers is enlarged in the drawings.

Figure 3A:
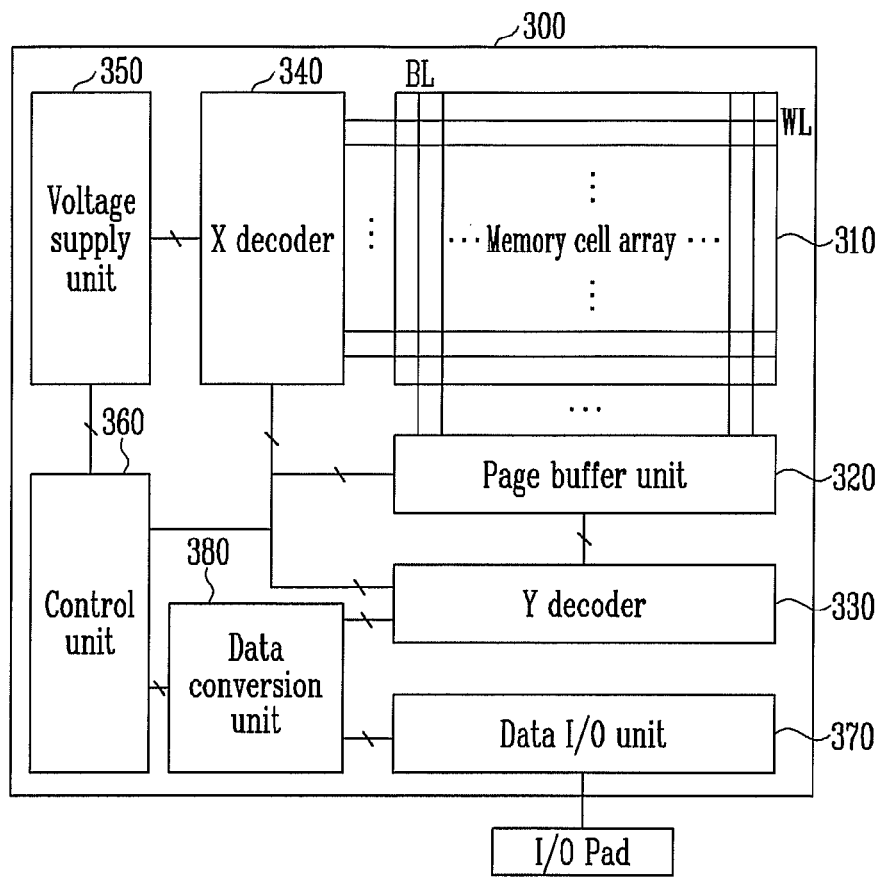
FIG. 3A is a block diagram showing the construction of a nonvolatile memory device according to an embodiment.

FIG. 3A is a block diagram showing the construction of a nonvolatile memory device according to an embodiment.

In FIG. 3A, the nonvolatile memory device 300 includes a memory cell array 310, a page buffer unit 320, a Y decoder 330, an X decoder 340, a voltage supply unit 350, a control unit 360, a data I/O unit 370, and a data conversion unit 380.

The memory cell array 310 includes cell strings to each of which memory cells for storing data are connected in series. Each of the cell strings is connected to a bit line BL. The gates of the memory cells are connected to respective word lines WL in a direction that intersects the bit line BL.

The memory cells included in the memory cell array 310 constitute memory blocks, so a plurality of the memory blocks is included in the memory cell array 310.

The page buffer unit 320 includes page buffers connected to the respective bit lines of the memory cell array 310. Each of the page buffers is configured to temporarily store data which will be programmed in a selected memory cell and then transfer the stored data to the selected memory cell through the bit line or to read data stored in a memory cell and store the read data.

The page buffer includes latch circuits. While a program operation is performed using one latch circuit, data to be cache-programmed may be input to the other latch circuit.

The Y decoder 330 provides an I/O path to the page buffers of the page buffer unit 320 in response to an input address. The X decoder 340 selects the word lines of the memory cell array 310 in response to an input address.

The voltage supply unit 350 generates operating voltages which will be provided to word lines connected by the X decoder 340 under the control of the control unit 360. The control unit 360 outputs a control signal according to an operation command and controls the voltage supply unit 350 so that the voltage supply unit 350 can provide a pass voltage, which is set depending on the degree of data program by the memory cell array 310.

The data I/O unit 370 functions to transfer data to be programmed, which is input through an I/O pad, to the data conversion unit 380 or to transfer data, which is decoded by and output from the data conversion unit 380, to the I/O pad.

The data conversion unit 380 encodes the data to be programmed, which is received from the data I/O unit 370, by using randomly generated data, and transfers the encoded data to the page buffer unit 320 via the Y decoder 330 so that the encoded data can be programmed.

On the other hand, when data is read, the data conversion unit 380 converts data, which is read by the page buffer unit 320, into the original input data by decoding the data read by the page buffer unit 320 in a reverse way to the encoding process and outputs the original input data to the data I/O unit 370.

The data conversion unit 380 is configured as follows.

Figure 3B:
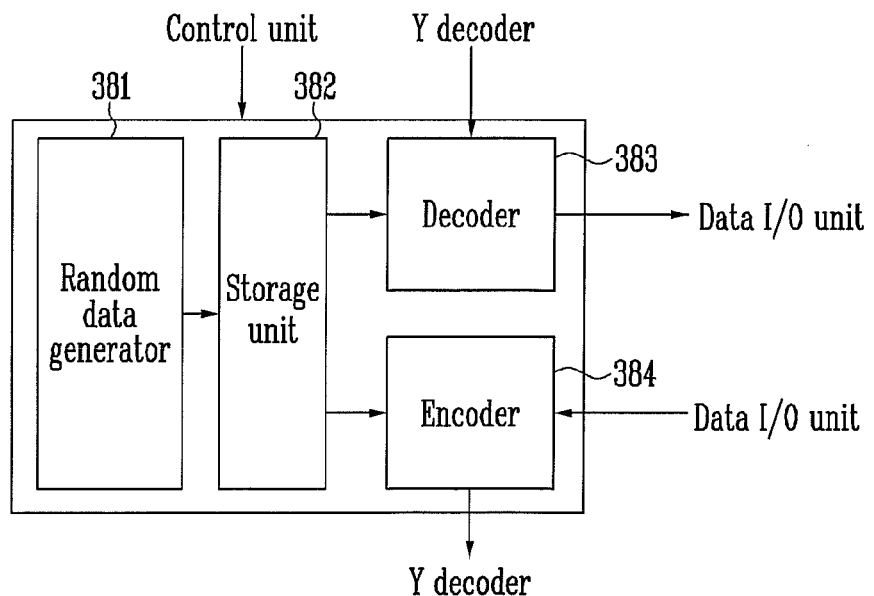
FIG. 3B is a block diagram showing the construction of a data conversion unit shown in FIG. 3A.

FIG. 3B is a block diagram showing the construction of the data conversion unit shown in FIG. 3A.

Referring to FIG. 3B, the data conversion unit 380 includes a random data generator 381, a storage unit 382, an encoder 384, and a decoder 383.

When the nonvolatile memory device 300 is initially operated, the random data generator 381 generates random data for each of the word lines of the memory cell array 310. The storage unit 382 stores the generated random data. The random data stored in the storage unit 382 is sorted according to memory block addresses. The random data corresponds to the respective word lines of a memory block on a bit-by-bit basis.

The random data generator 381 may be implemented using a pseudo random number generator or the like.

One of the memory blocks included in the memory cell array 310 is described below as an example. In the case where a memory block includes 32 word lines, bits of random data corresponding to the memory block corresponds to respective word lines on a one-to-one basis, thereby resulting in a total of 32 bits.

The encoder 384 receives data from the data I/O unit 370 and loads random data, corresponding to a word line to be programmed, from the storage unit 382 under the control of the control unit 370. The encoder 384 produces data to be actually programmed into memory cells using the input data and the loaded random data. Here, the loaded random data is 1-bit data set for the word line to be programmed.

The data to be programmed is created by performing an XOR operation on, for each of the bits of the input data, the input data bit and the corresponding loaded random data bit. The produced data to be programmed is input to the page buffer unit 320 via the Y decoder 330.

The decoder 383 creates output data by decoding the stored data. To this end, the decoder 383 reads data, which is stored in the page buffer unit 320, through a data read operation and loads the random data that corresponds to the word line on which the data read operation has been performed, from the storage unit 382 under the control of the control unit 370.

Furthermore, the decoder 383 creates data to be actually output by performing an XOR operation on the loaded random data and the read data. The data to be actually output is created by performing an XOR operation on, for each of the bits of the read data, the read bit and the corresponding random data bit.

Figure 3C:
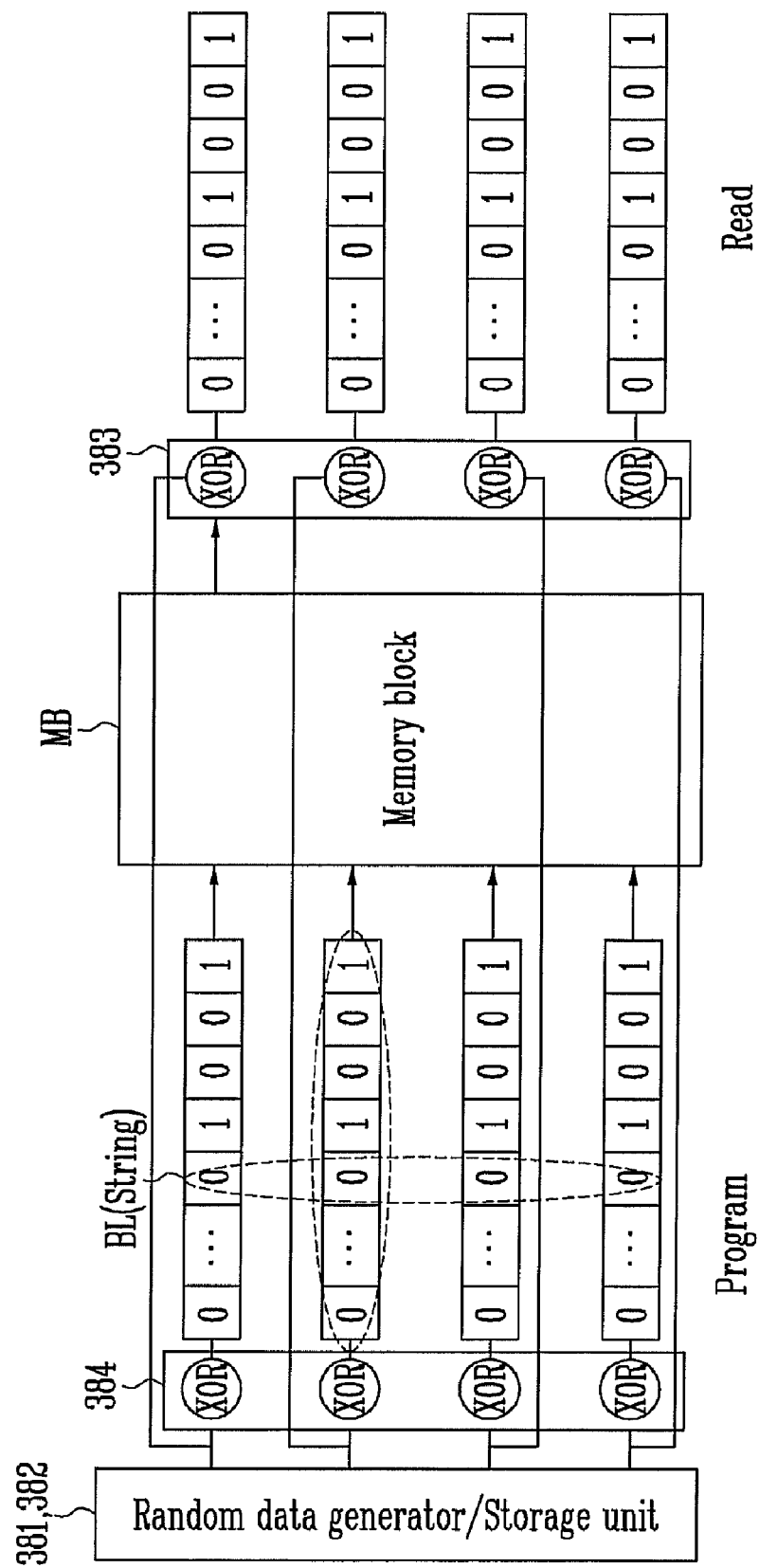
FIG. 3C is a diagram showing the encoded and decoded states of random data in FIG. 3B.

FIG. 3C is a diagram showing the encoded and decoded states of the random data in FIG. 3B.

FIG. 3C illustrates one memory block MB as an example. Random data corresponding to respective word lines is shown to correspond to one block, including the random data generator 381 and the storage unit 382.

In FIG. 3C, an XOR operation is performed on random data, corresponding to each of the word lines (or pages) of the memory block MB, and input data. Furthermore, output data is output after being subject to an XOR operation along with each of the random data.

The random data generated by the random data generator 381 is managed according to memory blocks. If the entire memory block is erased, stored random data may be deleted from the memory block, and new random data may be created and stored in the memory block.

Each of the ratio of memory cells on which a program operation has not been performed and the ratio of memory cells on which the program operation has been performed in the direction of a string using a method of, after the random data has been allocated to each of word lines as described above, performing an XOR operation on the random data and data input for programming and programming the XOR operation results or, after an XOR operation has been performed on the random data and the stored data, outputting the XOR operation results is up to about 50%. Accordingly, the influence of BPD can be prevented.

The program and read operations of the nonvolatile memory device 300 are described below in more detail.

Figure 3D:
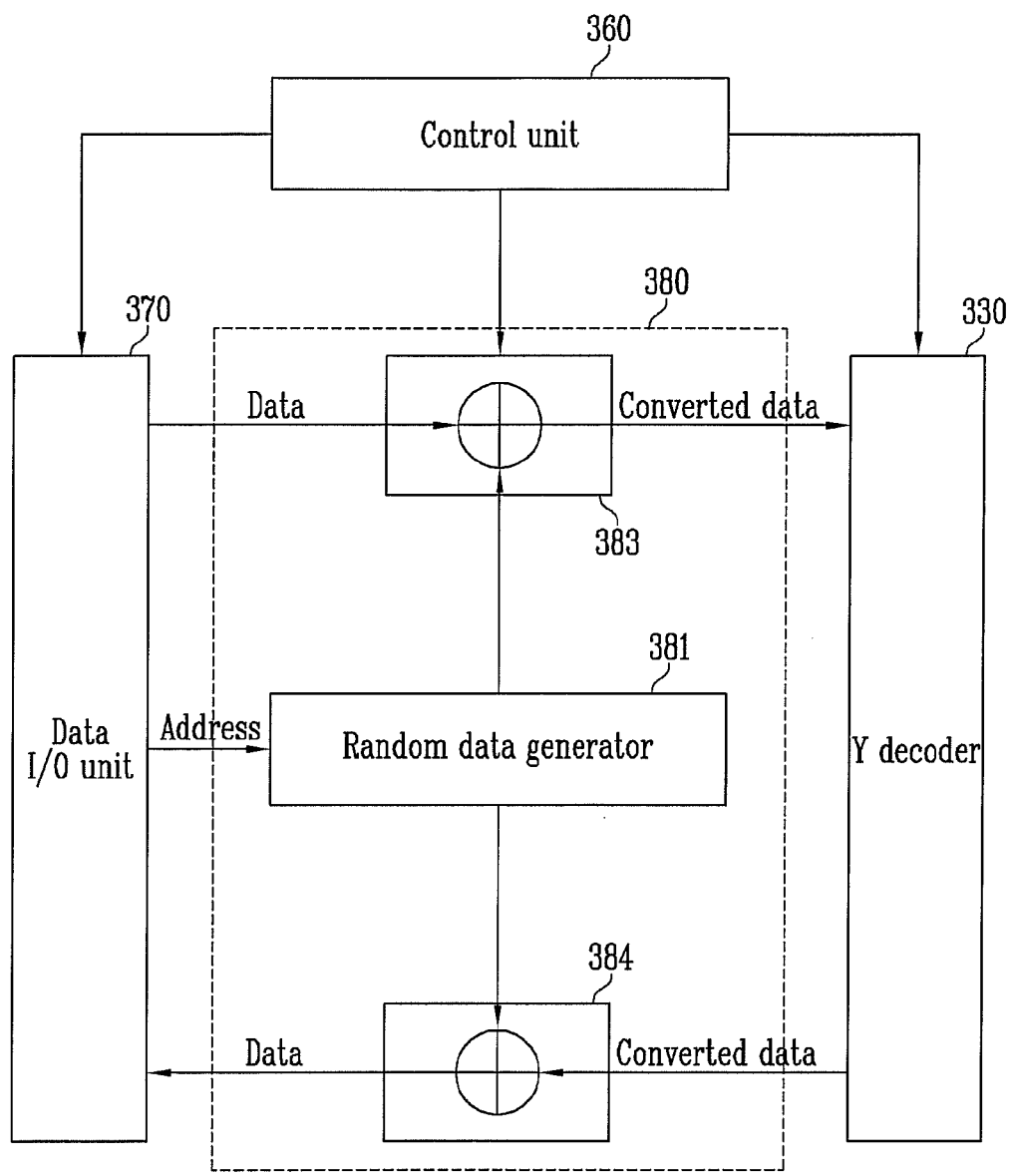
FIG. 3D is a block diagram showing the construction of the data conversion unit according to another embodiment.

FIG. 3D is a block diagram showing the construction of the data conversion unit according to another embodiment.

Referring to FIG. 3D, the data conversion unit 380 includes a random data generator 381, a decoder 383, and an encoder 384. This embodiment does not include a storage unit in the previous embodiment.

The random data generator 381 generates random data based on the addresses of a memory block and a word line on which a program or read operation has to be performed, where the addresses are received from the data I/O unit 370.

Here, the random data generated by the random data generator 381 according to this embodiment is generated in the same manner for the same address, so an additional storage unit is not necessary.

Furthermore, the decoder 383 or the encoder 384 converts the random data, generated by the random data generator 381, and input or output data through logical combinations in the same manner as in the previous embodiment, and then inputs or output the resulting data to or from the Y decoder 330.

Figure 4:
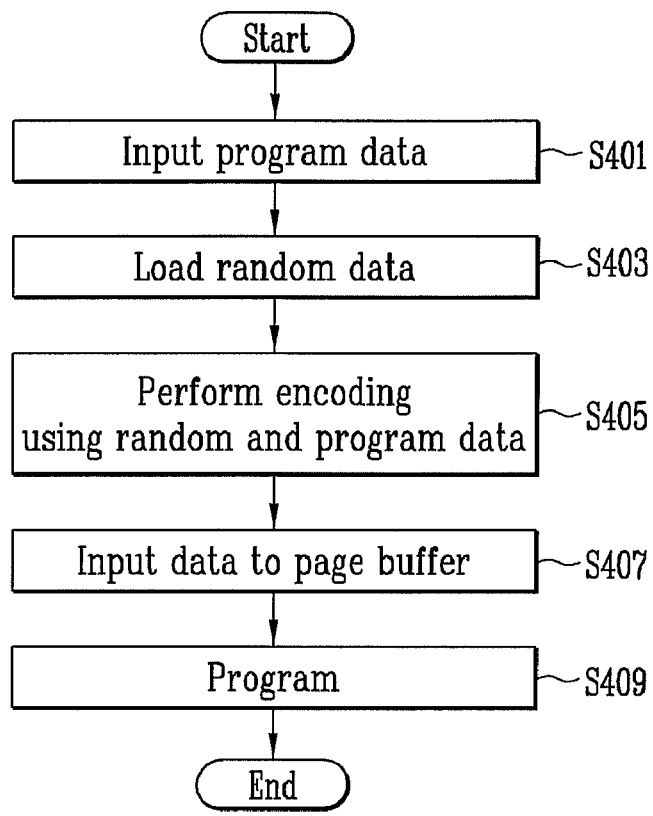
FIG. 4 is a flowchart showing a program operation performed by the nonvolatile memory device according to yet another embodiment.

FIG. 4 is a flowchart showing a program operation performed by the nonvolatile memory device according to yet another embodiment.

Referring to FIG. 4, a command for programming, together with data to be programmed, is input to the data I/O unit 370 via the I/O pad at step S401. The data I/O unit 370 transmits the input data, received from the I/O pad, to the encoder 384 of the data conversion unit 370.

The encoder 384 loads random data, which is set for a word line to be programmed, from the storage unit 382 in response to a control signal from the control unit 360 at step S403. The random data is, as described above with reference to FIGS. 3A to 3C, data which has been generated by the random data generator 381 of the data conversion unit 380 by memory blocks and has been stored in the storage unit 382.

The encoder 384 generates data to be programmed using the input data and the loaded random data at step S405. The generated data to be programmed is input to the page buffers of the page buffer unit 320 at step S407.

The data to be programmed is produced by performing an XOR operation on the random data and the input data, as described above.

For example, assuming that data input for programming is '111001' and random data set to a word line into which the corresponding data will be programmed is '1,' data to be programmed becomes '000110.'

The data to be programmed is input to the page buffers of the page buffer unit 320 and is programmed into memory cells at step S409.

In the case where data changed using random data is programmed as described above, each of the case where memory cells are program cells in a string and the case where the memory cells are erase cells in the string can be controlled not to exceed up to 50%. Accordingly, BPD occurring depending on the degree that peripheral cells are programmed can be solved.

On the other hand, a method of reading the data programmed as described above is described below.

Figure 5:
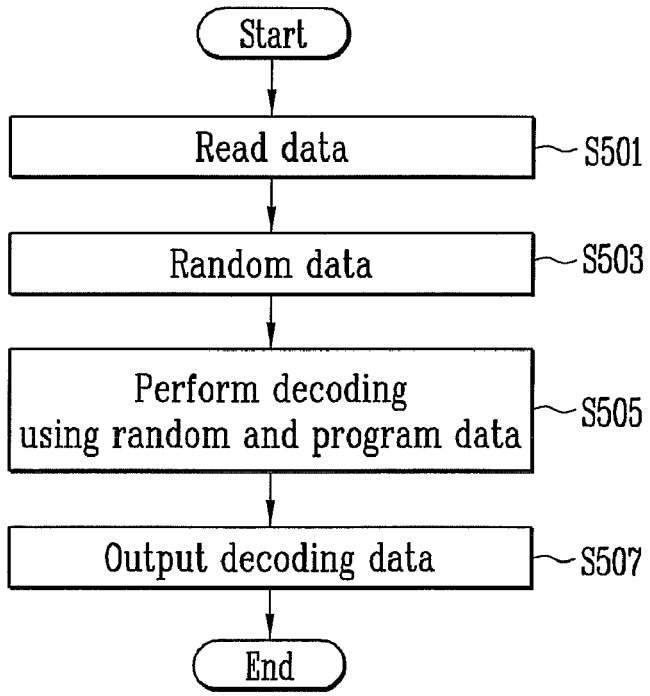
FIG. 5 is a flowchart showing a read operation performed by the nonvolatile memory device according to still yet another embodiment.

FIG. 5 is a flowchart showing a read operation performed by the nonvolatile memory device according to still yet another embodiment.

Referring to FIG. 5, the control unit 370 reads the data of a selected word line (or page) of the memory cell array 310 in the page buffer unit 320 in response to a read command at step S501.

The data read in the page buffer unit 320 is transmitted to the decoder 383 via the Y decoder 330. The decoder 383 loads random data, which is set for a word line from which the data has been read, under the control of the control unit 360 at step S503.

The decoder 383 then creates data to be output to the I/O pad using the loaded random data and the read data received from the page buffer unit 320 at step S505. The data to be output is, as described above, created by performing an XOR operation on the random data and the read data.

The example of FIG. 4 is described below. The programmed data is '000110.' Accordingly, data read in the page buffer unit 320 becomes '000110.' Furthermore, since the random data set for the corresponding word line is '1,' the decoder 383 creates the output data '111001' by performing an XOR operation on the random data and each of the bits of the read data. The output data '111001' is identical to the input data, which has been taken as an example in FIG. 4.

The output data created by the decoder 383 is output to the I/O pad via the data I/O unit 370 at step S507.

Accordingly, there is no change between input data and output data through the above operation, and each of the ratio of memory cells programmed into the memory cell array 310 and the ratio of memory cells not programmed into the memory cell array 310 is about up to 50%. Consequently, the influence of BPD can be reduced.

On the other hand, program and read operations performed by the nonvolatile memory device, including the data conversion unit 380 according to the embodiment of FIG. 3D, are described below.

Figure 6:
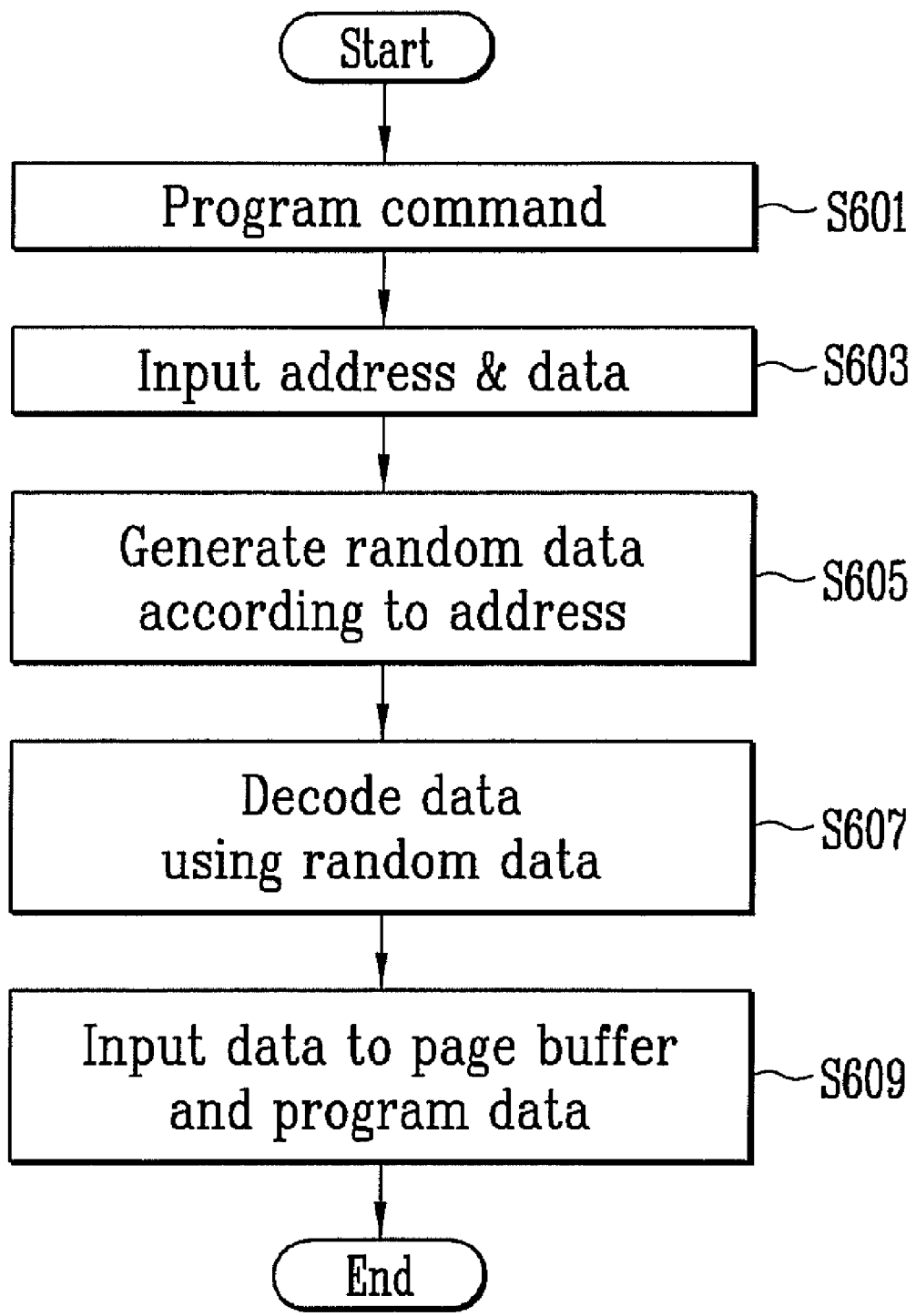
FIG. 6 is a flowchart showing a program operation performed by the nonvolatile memory device according to still yet another embodiment.

FIG. 6 is a flowchart showing a program operation performed by the nonvolatile memory device according to still yet another embodiment.

Referring to FIG. 6, a program command is input at step S601. An address and data on which program will be performed are input through the data I/O unit 370 at step S603.

The address and data are transferred to the data conversion unit 380. The random data generator 381 of the data conversion unit 380 creates random data based on the address at step S605. Here, the random data is created using a memory block address and a word line address, as described above with reference to FIG. 3D. The same random data is created when input addresses are identical to each other.

The created random data is provided to the encoder 384. The encoder 384 encodes the data, input from the data I/O unit 370, using the random data received from the random data generator 381 at step S607. In this embodiment, in order to encode the data, the random data and the data, input from the data I/O unit 370, are subject to an XOR operation.

The encoded data is transferred to the Y decoder 330. The Y decoder 330 transfers the encoded data to the page buffer unit 320 according to a control signal of the control unit 360. Furthermore, the page buffer unit 320 programs the encoded data into selected memory cells at step S609.

A method of reading the data programmed as described above is described below.

Figure 7:
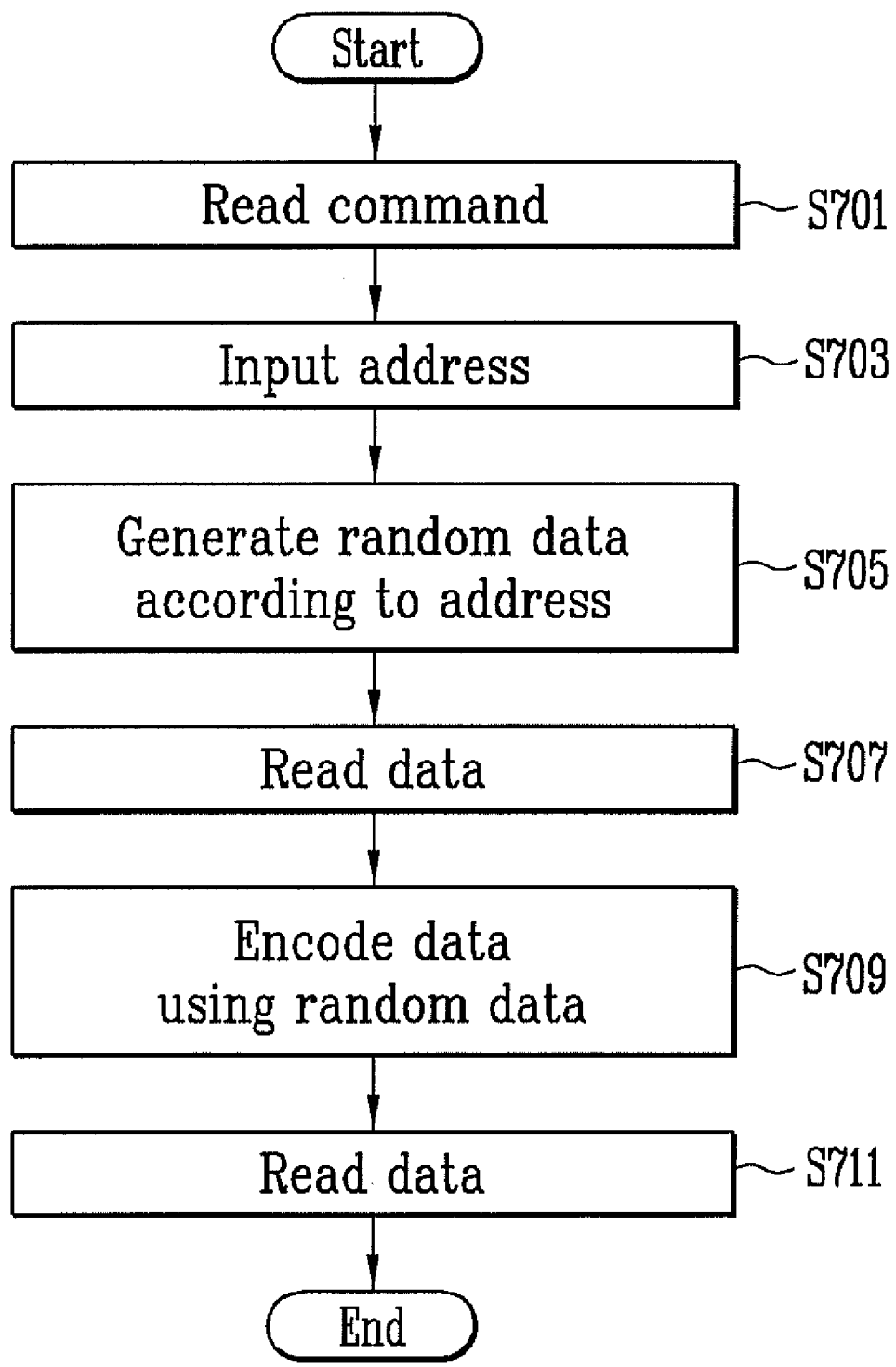
FIG. 7 is a flowchart showing a read operation performed by the nonvolatile memory device according to still yet another embodiment.

FIG. 7 is a flowchart showing a read operation performed by the nonvolatile memory device according to still yet another embodiment.

Referring to FIG. 7, a read command and an address from which data will be read are first input in order to read the data programmed according to the embodiment of FIG. 6 at steps S701 and S703.

The address from which data will be read is transferred to the data conversion unit 380 via the data I/O unit 370.

The random data generator 381 of the data conversion unit 380 creates random data using the input address at step S705. Here, the same random data is created for the same address, as described above. In other words, if the address on which the program operation has been performed in FIG. 6 is input as the read address, the same random data is created in FIG. 6.

The random data created at step S705 is transferred to the decoder 383.

Next, the control unit 360 reads the data of memory cells corresponding to the read address in response to a read command and stores the read data in the page buffer unit 320 at step S707.

The read data stored in the page buffer unit 320 is transferred to the decoder 383 of the data conversion unit 380 via the Y decoder 330.

The decoder 383 decodes the random data, received at step S705, and the read data received from the Y decoder 330 and outputs the decoding results to the data I/O unit 370. The decoder 383 decodes the read data into original data by performing an XOR operation on the random data and the read data, as in the previous embodiment.

In the case where random data created for an address by the random data generator 381, as described above, is identical, there is no need for a storage unit for creating and storing random data. Further, there is no need for a process of creating and storing or loading and using random data.

A function of performing data conversion may be performed by an external control device other than a nonvolatile memory device.

Figure 8:
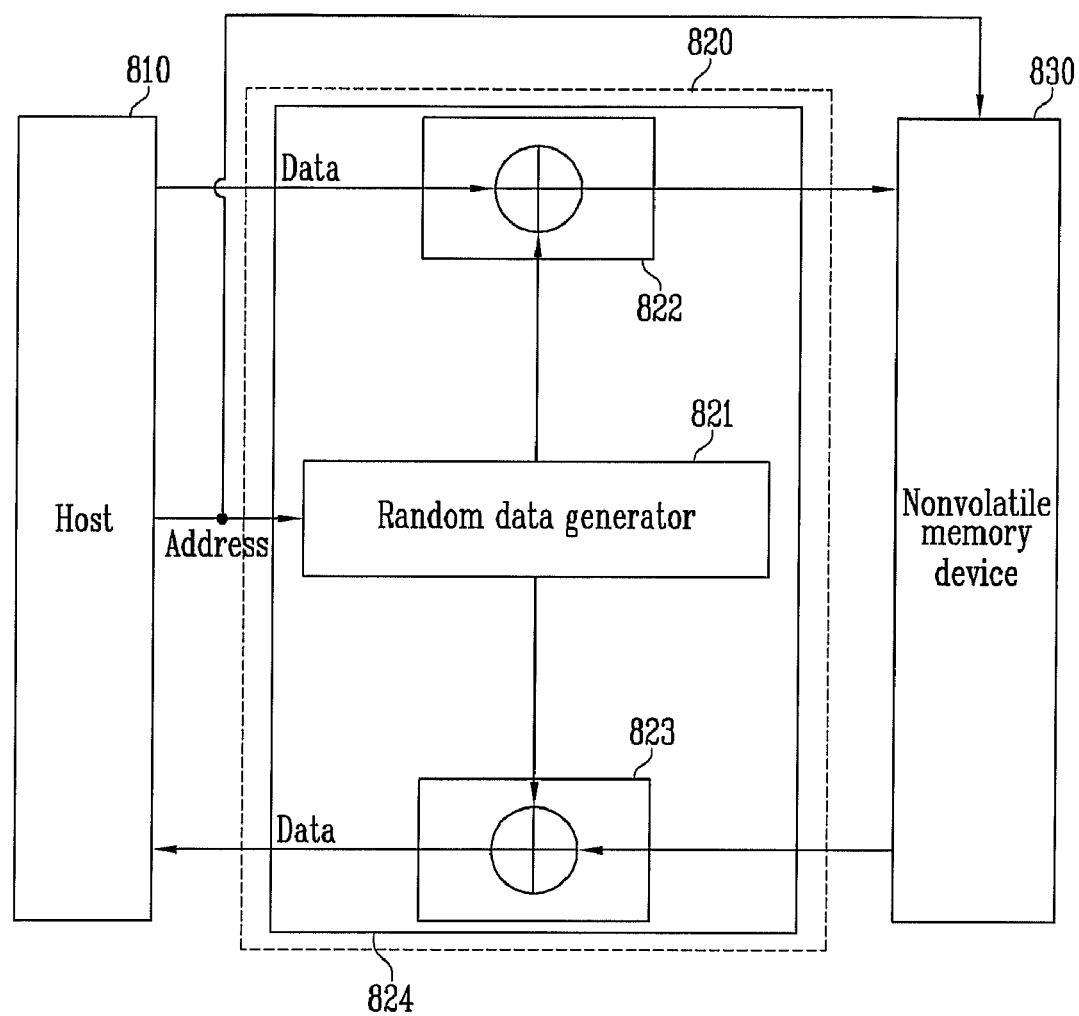
FIG. 8 is a block diagram showing the construction of the control device of a nonvolatile memory device according to still yet another embodiment.

FIG. 8 is a block diagram showing the construction of the control device of a nonvolatile memory device according to still yet another embodiment.

FIG. 8 illustrates an external control device 820 connected outside the nonvolatile memory device 830. The external control device 820 is connected to a host 810 and is configured to transfer data and commands, input to or output from the host 810, to the nonvolatile memory device 830 without change or process and transfer the data and commands to the nonvolatile memory device 830.

Referring to FIG. 8, the external control device 820 includes a data conversion unit 824 similarly to the previous embodiment. The external control device 820 creates random data based on an address input from the host 810, performs data decoding or encoding, and input or output the data decoding and encoding results to or from the nonvolatile memory device 830.

In the case where a data conversion unit 821 is added to the external control device 820 as in the previous embodiment, the influence of BPD can be reduced by controlling the ratio of program cells and erase cells using random data without changing the nonvolatile memory device 830. Furthermore, the external control device 820 may be modified further freely in order to control the ratio of cells.

As described above, according to the nonvolatile memory device and the method of operating the same and the control device for controlling the same, the ratio of cells to be programmed and the ratio of cells not to be programmed can be made similar to each using random data. Accordingly, the influence of neighboring programmed memory cells can be minimized.

What is claimed is:

1. A nonvolatile memory device, comprising:
a memory cell array in which memory cells are connected by word lines and bit lines;
a page buffer unit comprising page buffer circuits each configured to program encoded data into the memory cells or read data stored in the memory cells;
a data conversion unit configured to create random data and output the encoded data by using the random data and decode read data, wherein the random data is generated according to memory block address and word line address;
a Y decoder configured to connect the data conversion unit and the page buffer unit in response to address information; and
a control unit configured to control the data conversion unit so that the data conversion unit selects set data for encoding or decoding according to the address information.

2. The nonvolatile memory device of claim 1, wherein the data conversion unit comprises:
an encoder configured to create the encoded data by performing a logical operation on input data and the random data; and
a decoder configured to create the decoded read data by performing a logical operation on the encoded data that is read from the memory cells and the random data.

3. The nonvolatile memory device of claim 2, wherein the data conversion unit further comprises a storage unit configured to store the random data according to word line addresses.

4. The nonvolatile memory device of claim 2, wherein:
the encoder is configured to perform an XOR operation on the input data and the random data, and
the decoder is configured to perform an XOR operation on the encoded data and the random data.

5. A nonvolatile memory device, comprising:
a data conversion unit, wherein the data conversion unit comprises:
a random data generator configured to generate random data according to memory block address and word line address;
an encoder configured to create encoded data to be programmed into memory cells by performing a logic operation on the random data and input data for programming; and
a decoder configured to create decoded data by performing a logical operation on the encoded data that is read from the memory cells.

6. The nonvolatile memory device of claim 5, wherein the random data generator is configured to generate the random data having a first logic level or a second logic level according to the memory block address and the word line address.

7. The nonvolatile memory device of claim 5, wherein:
the encoder is configured to perform an XOR operation on the input data and the random data, and
the decoder is configured to perform an XOR operation on the encoded data and the random data.

8. A control device for controlling a nonvolatile memory device, comprising:
a data conversion unit, wherein the data conversion unit comprises:
a random data generator configured to generate random data according to memory block address;
an encoder configured to create encoded data by performing a logic operation on the random data and input data input from a host and to input the encoded data to the nonvolatile memory device, and
a decoder configured to create decoded data by performing a logic operation on the encoded data that is read from the nonvolatile memory device and the random data and to transmit the input data to the host.

9. The control device of claim 8, wherein the random data generator is configured to generate a unique random data having a first logic level or a second logic level according to the memory block address and the word line address.

10. The control device of claim 8, wherein:
the encoder is configured to perform an XOR operation on the input data and the random data, and
the decoder is configured to perform an XOR operation on the encoded data and the random data.

11. A method of operating a nonvolatile memory device, comprising:
generating a random data based on memory block address and word line address;
creating a encoded data by performing a logic operation on input data for programming and the random data for a word line selected for the programming; and
programming the encoded data into memory cells of the selected word line.

12. The method of claim 11, wherein the encoded data is created by performing an XOR operation on the random data and the input data.

13. The method of claim 11, wherein the random data for each of word line addresses is newly set by erasing the memory cells.

14. The method of claim 11, further comprising:
reading the encoded data from memory cells; and
creating the input data by performing a logic operation on the read encoded data and the random data.

15. The method of claim 11, wherein the input data is created by performing an XOR operation on the random data and the encoded data.

16. A method of operating a nonvolatile memory device, comprising:
creating a random data using a program or read command and using a memory block address and a word line address;
when the program command is input, creating encoded data by performing a logic operation on input data that is input for programming and the random data and programming the encoded data into memory cells corresponding to address information; and
when the read command is input, reading the encoded data stored in the memory cells corresponding to the address information, creating the input data by performing a logic operation on the encoded data and the random data, and outputting the created input data.

* * * * *